United States Patent [19]

Sawada et al.

[11] Patent Number: 4,901,320

[45] Date of Patent: Feb. 13, 1990

[54] SELF-CORRECTING SEMICONDUCTOR MEMORY DEVICE AND MICROCOMPUTER INCORPORATING THE SAME

[75] Inventors: Kikuzo Sawada; Kouzi Tanagawa; Nobuhiro Tomari; Tomoaki Yoshida, all of Tokyo, Japan

[73] Assignee: Oki Electric Industry Co., Ltd., Tokyo, Japan

[21] Appl. No.: 238,811

[22] Filed: Aug. 31, 1988

[30] Foreign Application Priority Data

Aug. 31, 1987 [JP] Japan ................................. 62-217544
Jun. 8, 1988 [JP] Japan ................................. 63-141401

[51] Int. Cl.$^4$ .............................................. G06F 11/10
[52] U.S. Cl. ..................................... 371/51.1; 371/13; 371/69.1
[58] Field of Search .......................... 371/13, 51, 69; 364/200 MS File, 900 MS File

[56] References Cited

U.S. PATENT DOCUMENTS 3,531,769  9/1970  Montgomery et al. ............... 371/69
3,582,880  6/1971  Beausoleit ............................ 371/13

OTHER PUBLICATIONS

Nikkei Electronics, Sep. 26, 1983, pp. 195–210; "High Speed 1M-bit Mask Rom with build-in ECC Circuit for Improved Yield"; Shibata, et al.

Primary Examiner—Charles E. Atkinson
Attorney, Agent, or Firm—Wenderoth, Lind & Ponack

[57] ABSTRACT

In a nonvolatile memory device or a microcomputer with a nonvolatile memory, data errors arising from loss of charge in the floating gates of memory cells are detected and corrected by applying two different sense voltages to the memory cells and comparing the outputs. Instead of using a cumbersome error-correcting code, this error-correcting scheme requires only one parity bit per word, yet it can detect and correct errors in any odd number of bits. Benefits include reduced chip size and longer life for electrically erasable and programmable memories.

23 Claims, 8 Drawing Sheets

SELF-CORRECTING SEMICONDUCTOR MEMORY DEVICE AND MICROCOMPUTER INCORPORATING THE SAME

BACKGROUND OF THE INVENTION

This invention relates to a nonvolatile semiconductor memory device such as an electrically erasable and programmable read-only memory (EEPROM) having the ability to correct bit errors resulting from the degradation of memory cells, and to a microcomputer incorporating such a memory device.

Nonvolatile semiconductor memories are used for storing data on a permanent or semipermanent basis in a wide range of electronic devices including computers, computer peripheral equipment, office equipment, game machines, and IC cards. Although highly reliable, these nonvolatile semiconductor memories are not entirely free of bit errors caused by degradation of their constituent memory cells. In particular, EEPROM memories inevitably suffer degradation if they are reprogrammed frequently. The reliability of a nonvolatile semiconductor memory device can obviously be enhanced if the device is able to detect and correct its own bit errors.

One prior-art scheme for self-correction bit errors, described in an article on a 1M-bit masked ROM on pages 195 to 210 in *Nikkei Electronics*, September 26, 1983, makes use of a Hamming error-correcting code. Data are stored in words consisting of $2^N$ bits each, and $N+1$ "parity bits" (error-correcting bits) are also stored for each word. For example, to store a four-bit data word (N=2), seven bits are used: the four data bits and three parity bits. The redundancy provided by the parity bits enables arbitrary one-bit errors to be detected and the bit in error to be identified. The memory device is constructed with AND and NOR gates that automatically check each word as it is read, detect any one-bit errors, and correct the value of the error bit in the output. Errors in more than one bit at a time cannot be reliably corrected by this scheme.

A similar scheme can be employed in a single-chip microcomputer comprising a central processing unit, input/output circuits, and memory on a semiconductor chip. The memory stores data in $2^N$-bit words, with (N+1) additional parity bits for each word. An error-correcting-code (ECC) circuit is interposed between the memory and the data bus. When data are written in the memory, the ECC circuit generates the necessary parity bits and supplies these together with the data bits to the memory. When data are read from the memory, the ECC circuit checks the data and parity bits, detects and corrects any one-bit errors, and places the correct data on the data bus.

A major drawback of these prior-art error-correcting schemes is the large number of extra bits required. The widely-used eight-bit word format, for example, requires four parity bits per word; error-correcting by this scheme increases the total number of bits that must be stored by a factor of 1.5. The size of the memory cell array must therefore be increased by a factor of 1.5, and still further space is required for the error-correction circuitry. Error correcting by this scheme thus exacts a high penalty in terms of chip area, necessitating larger chips. One unfortunate consequence of this is reduced yield of the fabrication process, because there are fewer chips per wafer. As noted in the reference cited above, the reduction in yield due to chip size tends to offset any gain in yield realized through the correction of bit errors. A low yield translates into a high cost per chip.

In single-chip microcomputers employing this error-correcting scheme, the increased size of the memory cell array places particularly severe constraints on the space left for other on-chip facilities, and the complexity of the error-correcting-code circuit complicates the chip design.

SUMMARY OF THE INVENTION

An object of this invention is to provide a self-correcting semiconductor memory device that avoids the problems of low yield and high cost due to increased chip size, and a microcomputer incorporating such a self-correcting semiconductor memory device that does not require a complex error-correcting-code circuit.

In a nonvolatile memory device or a microcomputer with a nonvolatile memory according to the invention, data errors arising from loss of charge in the floating gates of memory cells are detected and corrected by applying two different sense voltages to the memory cells and comparing the outputs. Instead of using a cumbersome error-correcting code, this error-correcting scheme requires only one parity bit per word, yet it can detect and correct errors in any odd number of bits. Benefits include reduced chip size and longer life for electrically erasable and programmable memories.

DETAILED DESCRIPTION OF THE EMBODIMENTS

Before the embodiments of the invention are described, the voltage characteristics and operation of a nonvolatile semiconductor memory device will be described, taking an EEPROM as an example.

Figure 1:
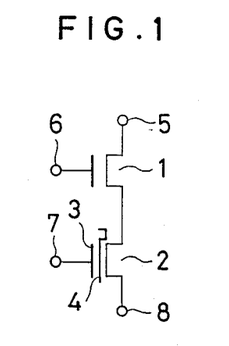
FIG. 1 is a schematic drawing of an EEPROM memory cell.

FIG. 1 shows a schematic diagram of an EEPROM memory cell for storing one bit of data. This memory cell is described in, for example, an article on a 16K.-bit EEPROM on pages 198 to 207 of *Nikkei Electronics*, June 23, 1980, and in Japanese Laid-open Patent Application No. 1987/32823.

The EEPROM memory cell in FIG. 1 comprises a select transistor 1 and a memory transistor 2. The memory transistor 2 has a two polysilicon gate layers: a control gate 3 and a floating gate 4. The floating gate 4 is disposed between the control gate 3 and the channel of the memory transistor 2, and extends to a thin, localized oxide region (called a tunnel oxide) over the drain electrode. The data bit in the memory cell is written or erased by injecting electrons or holes into the floating gate 4 through this tunnel oxide. The drain electrode of the select transistor 1 is connected to a bit line 5, its gate electrode is connected to a word line 6, and its source electrode is connected to the drain electrode of the memory transistor 2. The control gate 3 of the memory transistor 2 is connected to a sense (or program) line 7, and its source electrode is connected to the cell ground line 8. The source electrode, gate electrode, and drain electrode will hereinafter be referred to simply as the source, gate, and drain.

Table 1 indicates the voltages applied to the bit line 5, the word line 6, the sense line 7, and the cell ground line 8 when the memory cell is read, erased, and written. These operations will be described below.

TABLE 1

| Mode | Read, Erase, and Write Voltages | | | |
|---|---|---|---|---|
|  | Bit line | Word line | Sense line | Ground line |
| Read | 2 V | 5 V | 2 V | 0 V |
| Erase | 0 V | 20 V | 20 V | 0 V |
| Write | 20 V | 20 V | 0 V | Floating |

When the memory cell is read, a voltage of 5 V, for example, is applied to the word line 6 to turn on the select transistor 1, and voltages of, for example, 2 V are applied to the bit line 5 and the sense line 7. If the voltage applied to the sense line 7 (called the sense voltage) suffices to turn on the memory transistor 2, then the bit line 5 is connected to ground (OV) and the data bit in the memory cell is read as a "0." If the sense voltage applied to the sense line 7 does not turn on the memory transistor 2, the data bit is read as a "1."

The threshold voltage Vtc which must be applied to the sense line 7 to switch the memory transistor 1 on depends on the charge stored in the floating gate 4. If the floating gate 4 is already positively charged, then a small additional voltage applied to the sense line 7 will turn the memory transistor 1 on; indeed, the charge in the floating gate 4 may itself be sufficient to turn the memory transistor 1 on. In this state the memory cell stores the data "0." If the floating gate is negatively charged, then a small voltage applied to the sense line 7 will not turn the memory transistor 1 on and the data will be read as a "1."

The operation of storing a negative charge in the floating gate 4 is called erasing the memory cell. As indicated in Table 1, the memory cell is erased by applying a high programming voltage (Vpp) such as 20 V to the word line 6 and the sense line 7, and applying the ground level of 0 V to the bit line 5 and the cell ground line 8. The voltage applied to the word line 6 turns on the select transistor 1, and the other voltages create a sufficient potential difference across the floating gate 4 to inject electrons from the drain into the floating gate 4 by the tunnel effect, thus raising the threshold voltage Vtc and causing the memory cell to store the data "1."

The operation of storing a positive charge in the floating gate 4 is called writing the memory cell. As indicated in Table 1, the memory cell is written by applying the programming voltage Vpp (20 V) to the bit line 5 and the word line 6, placing the sense line 7 at the ground potential of 0 V, and disconnecting the cell ground line 8. The select transistor 1 is in the on state as in the erase operation, but now the potential difference across the floating gate 4 acts in the opposite direction to the potential difference when the cell is erased, so electrons tunnel out from the floating gate 4 to the drain and holes are injected into the floating gate 4, thus lowering the threshold voltage Vtc. In this state the memory cell stores the data "0."

Figure 2:
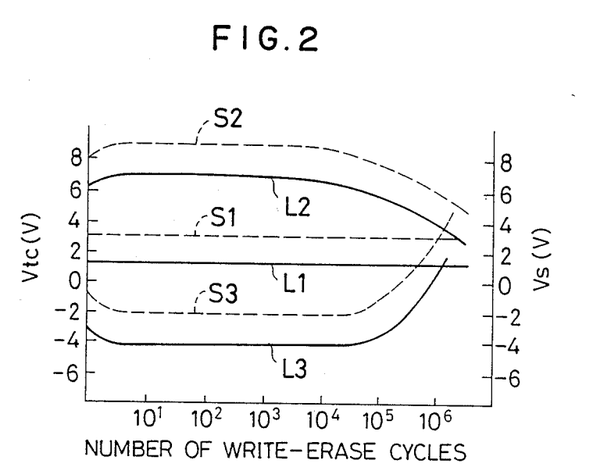
FIG. 2 is a graph illustrating changes in the voltage thresholds of the memory cell in FIG. 1.

FIG. 2 shows the Vtc characteristics when the memory cell in FIG. 1 is repeatedly reprogrammed. The threshold voltage Vtc is shown on the vertical axis; the number of write-erase cycles is shown on the horizontal axis. The changes in the threshold voltage Vtc when the cell is written and erased are plotted in relation to the number of write-erase cycles. The programming voltage Vpp and the write or erase time are constant. The line marked L1 in FIG. 2 indicates the threshold voltage Vtc when no charge is present in the floating gate 4; this threshold voltage Vtc is, for example, 1 V. The lines marked L2 and L3 show the threshold voltage Vtc when the memory cell is erased and written, respectively.

The tunneling of electrons and holes when the memory cell is written or erased alters the electrical properties of the tunnel oxide region. The cumulative effect of the alterations is to reduce the insulation breakdown voltage in the tunnel oxide region, to limit the amount of charge that can be stored in the floating gate 4, and to shorten the charge retention time. In FIG. 2, no degradation of the Vtc characteristic is visible over approximately the first $10^3$ write-erase cycles, but after $10^4$ write-erase cycles the charge injected into the floating gate by read and write operations begins to decline, and after $10^6$ write-erase cycles the difference between Vtc in the written and erased states is considerably narrowed. For example, whereas the erase and write values of the threshold voltage after $10^3$ write-erase cycles Vtc were 7 V and $-4$ V, respectively, they are respectively 4 V and 0.5 V after $10^6$ write-erase cycles.

The memory cell is read by a sense amplifier that detects and amplifies the current on the bit line 5 in FIG. 1. A large current is read as a "0;" a small current is read as a "1." The current value at which the sense amplifier changes between the "0" and "1" output states is called the sense threshold current Is. Usually the memory cell is designed so that Is is a little larger than the current It that flows when the voltage applied to the sense line 7 is exactly the threshold voltage Vtc. Accordingly, the threshold sense voltage Vs at which the output of the cell changes between "0" and "1" is a little higher than the transistor on/off threshold voltage Vtc. The lines marked S1, S2, and S3 in FIG. 2 indicate the threshold sense voltages when the memory cell is in the uncharged, erased ("storing "1" data), and written (storing "0" data) states, respectively. In the uncharged state, for example, when the threshold voltage Vtc is L1 (1 V) in FIG. 2, the threshold sense voltage Vs is S1 (3 V), so the sense amplifier output inverts at the point at which 3 V is applied to the sense line. Similarly, when the threshold voltage Vtc is L2 the sense threshold voltage Vs is S2 (approximately 9 V), and when the threshold voltage Vtc is L3 the sense threshold voltage Vs is S3 (approximately $-2$ V). If the sense voltage Vr1 applied to the sense line 7 when the memory cell is read is 2 V, then the following relation holds:

$$S2 > S1 > Vr1 > S3 \quad (1)$$

Next we shall consider what happens in a memory device satisfying relation (1) if the threshold voltage Vtc of the memory cell changes due to leakage of charge. Such leakage may be caused by degradation of the breakdown voltage of the tunnel oxide after a large number of write-erase cycles, or by a pinhole.

Figure 3:
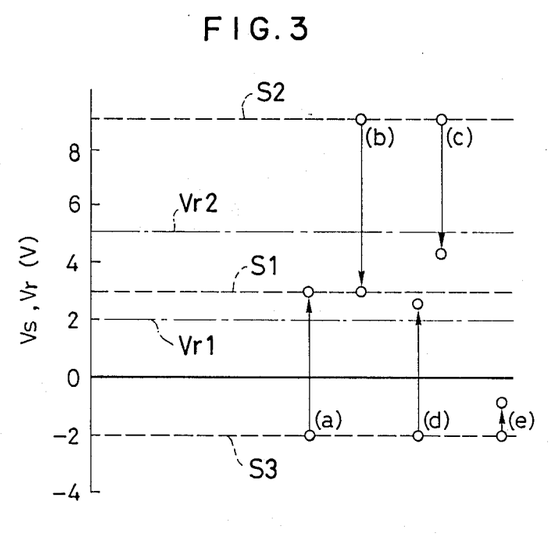
FIG. 3 is a graph illustrating the effect of the charge leakage in the memory cell in FIG. 1.

FIG. 3 shows the characteristics of a memory cell satisfying relation (1). Consider first the case (a) in which the charge stored in the written state escapes completely. The sense threshold voltage Vs then changes from S3 (−2 V for example) to S1 (3 V for example), and since the sense voltage Vr is Vr1 (2 V for example), the data output obtained from the sense amplifier changes from "0" to "1." Next consider the case in which the charge completely escapes from a memory cell in the erased state (b) and the sense threshold voltage Vs changes from S2 (9 V for example) to S1 (3 V for example). Since the sense voltage Vr is Vr1 (2 V for example), the data output remains "1." Similarly, a partial leakage of charge from a memory cell, in the erased state as in case (c) leaves the "1" data output unaltered.

When part of the charge escapes from a memory cell in the written state, if the resulting sense threshold voltage Vs of the memory cell is higher than the sense voltage Vr1 as in case (d), the data output changes from "0" to "1," but if the resulting sense threshold voltage Vs of the memory cell is lower than the sense voltage Vr1 as in case (e), the data output remains "0."

To summarize, in cases (a) and (d) the bit output changes from "0" to "1," in cases (b) and (c) the bit remains unchanged at "1," and in case (e) the bit remains unchanged at "0." That is, if the memory cells and circuits of a memory device are designed so as to satisfy the aforementioned relation (1), the escape of charge from a memory cell in the erased state does not cause the output data value to change, but the escape of charge from a memory cell in the written state may cause a change in the output data.

Figure 4:
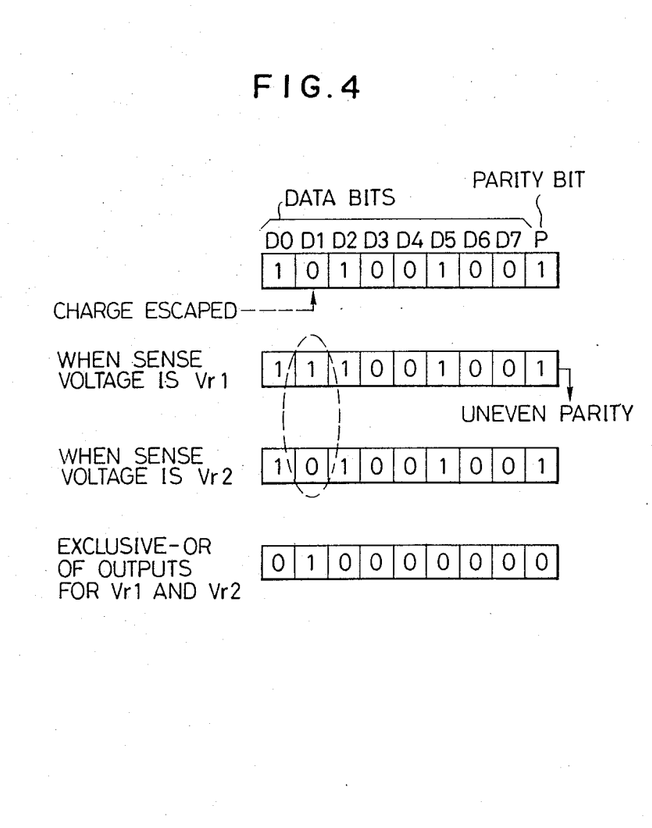
FIG. 4 illustrates the detection of a bit error in case (a) in FIG. 3.
Figure 5:
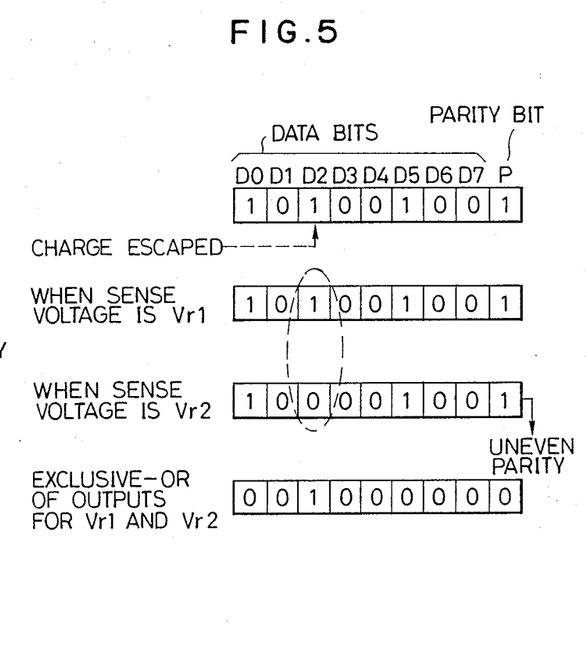
FIG. 5 illustrates the detection of a bit error in case (b) in FIG. 3.

The principle of this invention is to apply a second sense voltage Vr2 differing from the first sense voltage Vr1 when the cell is read. Memory cells that have changed in threshold due to charge loss can be recognized by a change in the data output obtained with these differing sense voltages, and incorrect data can be corrected. This principle will be explained with reference to FIG. 3, FIG. 4, and FIG. 5. FIG. 4 shows case (a) in FIG. 3, illustrating the principle of correction for a 1-byte (8-bit) memory cell array comprising data bits $D_0$ to $D_7$ and one parity bit P. FIG. 5 illustrates the principle of correction for case (b) in FIG. 3.

In FIG. 3, suppose the data are read with sense voltages Vr1=2 V and Vr2=5 V. In case (a) in FIG. 3, the data output changes from "0" to "1" under Vr1=2 V, but remains unchanged at "0" under Vr2=5 V. In case (b) under Vr1=2 V the data output remains unchanged at "1," but under Vr2=5 V the data output value changes from "1" to "0." Faulty memory cells can thus be detected and corrected by comparing the two data outputs.

Assume that in the memory under discussion even parity is used; that is, the parity bit P in FIG. 4 and FIG. 5 is set so that the 1-byte array as a whole has even parity (an even number of "1" bits.)

In FIG. 4, which corresponds to case (a) in FIG. 3, if charge escapes from the memory cell storing bit $D_1$, when the sense voltage is Vr1, data bit $D_1$ changes from "0" to "1," destroying the even parity relationship. When the sense voltage is raised to Vr2, however, the data bit $D_1$ reverts to its true value of "0." The data from the other bits $D_0$ and $D_2$ to $D_7$ remain unchanged when the sense voltage Vr2 is applied, as does the parity bit, so the even parity relationship remains true. In the bottom line of FIG. 4 the data bits $D_0$ to $D_7$ and parity bit P read with sense voltage Vr1 are exclusive-ORed with the data bits $D_0$ to $D_7$ and parity bit P read with sense voltage Vr2. The result of this exclusive-OR is a "0" for the correct bits, that is, bits in memory cells that have not lost charge, but a "1" for the bit $D_1$. In this way the escape of charge from the data bit $D_1$ is detected. Thus when the reading of the data with sense voltage Vr1 results in uneven parity it can be determined that the data bit $D_1$ has changed from "0" to "1" and the data output can be corrected.

Similarly in FIG. 5, corresponding to case (b) in FIG. 3 in which charge has escaped from the memory cell for data bit $D_2$, when read with sense voltage Vr1, data bit $D_2$ retains its value of "1," but when next read with sense voltage Vr2, data bit $D_2$ changes from "1" to "0," destroying the even parity relationship. The escape of charge from the data bit $D_2$ can be detected by taking the exclusive-OR of the data read with the sense voltages Vr1 and Vr2. Since even parity is valid in the data read with the sense voltage Vr1, these data are assumed to be correct and are output without being corrected.

Figure 6:
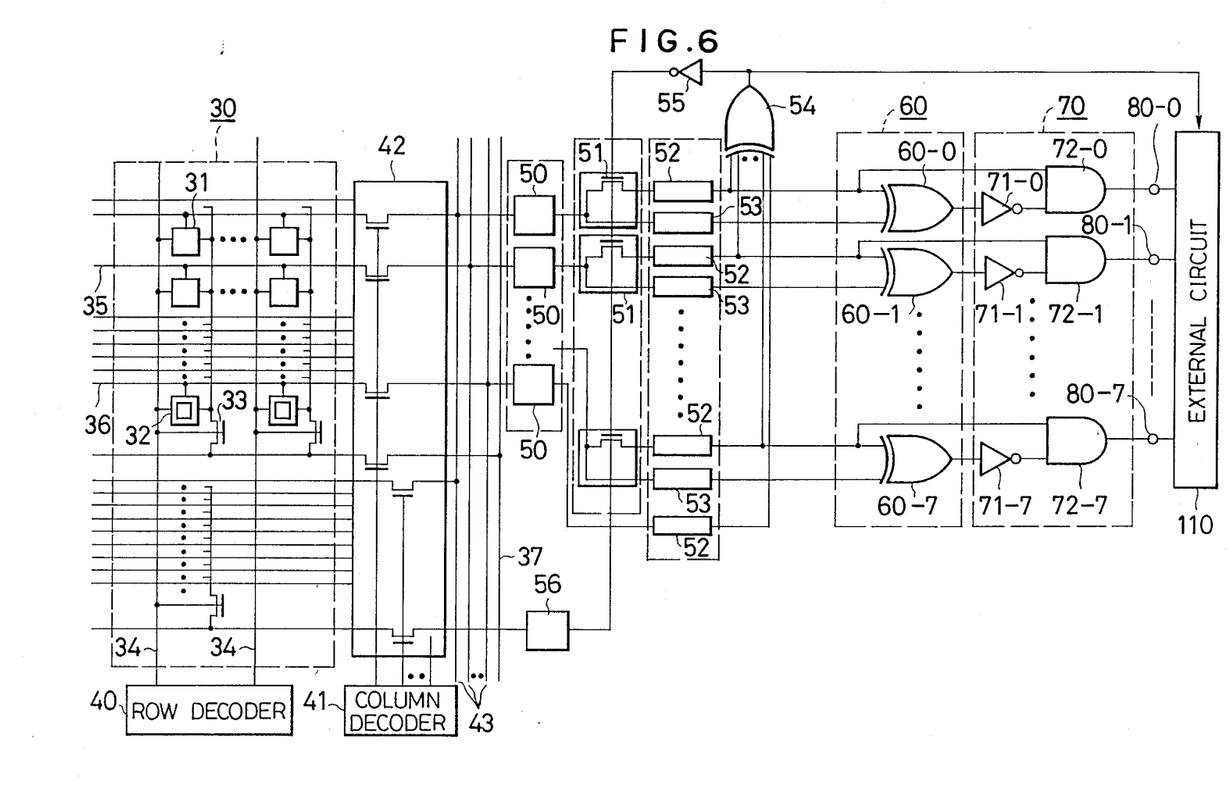
FIG. 6 is a schematic diagram of a self-correcting semiconductor memory device according to an embodiment of the invention.

FIG. 6 illustrates a self-correcting semiconductor memory device according to an embodiment of the present invention, based on the error-correcting principle explained above.

The self-correcting semiconductor memory device in FIG. 6 is an EEPROM comprising a memory cell array 30. The memory cell array 30 comprises a plurality of nonvolatile memory cells 31 for storing data, a plurality of parity cells 32 for storing parity data, and a plurality of select transistors 33 for applying sense voltage to memory cells a byte at a time. Each memory cell 31 is connected to a word line 34, a bit line 35, and a sense line 37. Each parity cell 32 is connected to a word line 34, a parity bit line 36, and the sense line 37. The word lines 34 are connected to a row decoder 40. The bit lines 35 and the parity bit lines 36 are connected through a multiplexer 42 controlled by a column decoder 41 to internal input/output (I/O) lines 43. The row decoder 40, the column decoder 41, and the multiplexer 42 provide a means of selecting a single memory cell 31 or a parity cell 32. Specifically, by means of a row addresses, the row decoder 40 selects a plurality of memory cells 31 in the bit line direction in the memory cell array 30; by means of a repeated column address the column decoder 41 selects a group of, for example, eight memory cells 31 and one parity cell 32 in the word line direction in the memory cell array 30; and the selected memory cells 31 and parity cell 32 are connected to the sense line 37 and to, for example, nine individual I/O lines 43.

The function of each I/O line 43 is to transfer data to and from a memory cell 31. The I/O lines 43 are connected to, for example nine sense amplifiers 50 that read and amplify the data. The outputs of the sense amplifiers 50 are connected through nine data latch select circuits 51 to nine pairs of temporary data memory circuits comprising respectively a first latch circuit 52 and a second latch circuit 53. There is one sense amplifier 50, one data latch select circuit 51, one first latch circuit 52, and one second latch circuit 53 for each I/O line 43. The outputs of the first latch circuit 52 and the second latch circuit 53 are connected to an exclusive-OR gate 54, the output of which is connected through an inverter 55 to the control input of the data latch select circuit 51, and also controls a sense voltage switching circuit 56 which provides a means of setting the sense voltage. Together the sense amplifier 50, the data latch select circuit 51, the first latch circuit 52, the second latch circuit 53, and the sense voltage switching circuit 56 provide a data read-out means. The exclusive-OR gate 54 is a parity checking means for checking the parity of the data read by the read-out means; that is, it functions as a parity-checking circuit.

The outputs of the first latch circuit 52 and the second latch circuit 53 are connected to an agreement checking circuit 60 which is a means of checking whether the two data values match. The outputs of the agreement checking circuit 60 are connected through a self-correcting circuit 70, which is a means of correcting the read-out data, to eight data output terminals 80-0 to 80-7. The agreement checking circuit 60 comprises eight exclusive-OR gates 60-0 to 60-7. The self-correcting circuit 70 comprises eight inverters 71-0 to 71-7 which receive the outputs of the exclusive-OR gates 60-0 to 60-7, and eight AND gates 72-0 to 72-7 which receive the outputs of the first latch circuits 52 and the outputs of the inverters 70-0 to 70-7. The outputs of the AND gates 72-0 to 72-7 are connected to the output terminals 80-0 to 80-7.

The circuit in FIG. 6 operates as follows. Assume that in the read mode, the voltages indicated in Table 1 are applied to the selected memory cells 31 and the sense voltage on the sense line 37 has the value Vr1 illustrated in FIG. 3. Assume that the data in the memory cells 31 and parity cell 32 have been stored with even parity.

Consider the case in which a fault has arisen in the memory transistor in one of the memory cells 31 in the data byte selected by the row decoder 40 and the column decoder 41, allowing stored positive charge to escape from the floating gate.

The byte of data from the memory cells 31 is transferred through the multiplexer 42 and I/O lines 43 to the sense amplifiers 50 which detect and amplify the data, then pass the data through the data latch select circuits 51 to the first latch circuits 52 and the second latch circuits 53 in which the data values are temporarily stored. The exclusive-OR gate 54 checks the parity of the nine bits of read data stored in the first latch circuits 52. If the parity is even, the output of the exclusive-OR gate 54 is "0;" if the parity is odd, the output of the exclusive-OR gate 54 is "1." If there is one defective memory cell 31 in which positive charge has escaped from the floating gate, when the sense voltage Vr1 is applied, as explained in FIGS. 3 and 4, the parity will be odd, so the output of the exclusive-OR gate 54 will be "1." This "1" output from the exclusive-OR gate 54 is inverted by the inverter 55, causing the data latch select circuits 51 to select the second latch circuits 53, so that the sense amplifiers 50 are electrically disconnected from the first latch circuits 52 and while kept coupled to the second latch circuits 53. If the output of the exclusive-OR gate 54 were "0," the data latch select circuits 51 would select both the first latch circuits 52 and the second latch circuits 53, and the sense amplifiers 50 would be connected to both the first latch circuits 52 and the second latch circuits 53.

The "1" output from the exclusive-OR gate 54 also switches the sense voltage in the sense voltage switching circuit 56, increasing it from Vr1 to Vr2. The memory cell array 30 remains in the read mode and the same byte remains selected. Under the sense voltage Vr2, the sense amplifiers 50 generate data output as explained in FIG. 4. When the defective memory cell was read with sense voltage Vr1, the output of the sense amplifier 50 was a "1," causing a violation of even parity, but when the sense voltage is increased to VR2, the output is recognized as a "0." This data value is stored in the second latch circuit 53 as the second read data.

The output of the first latch circuits 52 and the second latch circuits 53 are input to the exclusive-OR gates 60-0 to 60-7 which check for agreement between the outputs of the first latch circuit 52 and the second latch circuit 53 for each bit. An output of "0" from the exclusive-OR gates 60-0 to 60-7 indicates agreement; an output of "1" from the exclusive-OR gates 60-0 to 60-7 indicates disagreement. For data bits that have not lost charge, the data do not change when read with sense voltage Vr2, so the data output from the first latch circuit 52 and the second latch circuit 53 agree. For data bits that have lost charge, the data output from the first latch circuit 52 and the second latch circuit 53 disagree. For data bits that have not lost charge, the same data as output from the first latch circuit 52 are passed through the self-correcting circuit 70 to the data output terminals 80-0 to 80-7. For data bits that have lost charge, the inverters 71-0 to 71-7 and the AND gates 72-0 to 72-7 correct the output data from the first latch circuit 52 before the data are output at the output terminals 80-0 to 80-7.

Next consider the case in which negative charge has escaped from the memory transistor of a memory cell 31. In this case when read using the sense voltage Vr1, the data value output from the sense amplifier 50 does not change despite the loss of charge. The even parity relationship therefore remains valid and the data are output at the output terminals 80-0 to 80-7 without being corrected. That is, since the loss of negative charge does not cause an error in the circuit in FIG. 6, the circuit is designed not to correct the data unnecessarily.

When no parity error is found as a result of the parity check, the output of the exclusive-OR gate 54 is "0", so the voltage switch circuit does not apply the second sense voltage Vr2, and the contents of the first latch circuits 52 obtained as a result of reading with the first sense voltage Vr1 are transmitted without alteration to the terminals 80-0 to 80-7 of the self-correcting circuit 70 and used by an external circuit 110 as the correct read data.

Thus in the embodiment described, the second sense voltage Vr2 is applied only when a parity error is detected upon application of the first sense voltage Vr1. The external circuit 110 connected to the terminals 80-0 to 80-7 also receives the signal output from the exclusive-OR gate 54, according to which it recognizes as correct read data the outputs on the terminals 80-0 to 80-7 upon application of the first sense voltage Vr1 (after the first read data have been latched by the first and second latch circuits 52 and 53 and the effects of the latched first read data are transmitted to the terminals 80-0 to 80-7) if no parity error is detected upon application of the first sense voltage Vr1, and recognizes as correct read data the data on the terminals 80-0 to 80-7 upon application of the second sense voltage Vr2 if a parity error is detected and the second sense voltage Vr2 is applied.

As a modification, it is also possible to apply the first sense voltage Vr1 for the second time if no parity error is detected upon the first application of the first sense voltage Vr1. In this case, the same read data will again be entered in the latch circuits 52 and 53 upon the second application of the first sense voltage Vr1 the data in the first latch circuits 52 will be passed through the self-correcting circuit 70 without alteration. This scheme has an advantage in that the timing at which the correct data are obtained at the terminals 80-0 to 80-7 is fixed, i.e. it is always upon the second application of the sense voltage, and the sequence of operation is identical irrespective of whether or not there is an error in the read data.

A memory device according to this embodiment of the invention has the following advantages:

(1) Data correction can be achieved with only one parity bit per word, instead of the multiple parity bits (for example, four parity bits per eight-bit data word) required in the prior art. This enables a great reduction in chip size as compared with the prior art, and a corresponding reduction in chip cost.

(2) The provision of the error-correcting function in this embodiment enables an EEPROM to be reprogrammed for a larger number of write-erase cycles than in the prior art. When an EEPROM memory cell is repeatedly reprogrammed, it gradually becomes degraded, allowing charge to escape more easily from the floating gate, thus gradually increasing the threshold voltage of the memory cell in the written state, and lowering the threshold voltage in the erased state. The error-correcting function of this invention can, however, correct for memory cell degradation in at least one memory cell per eight data bits. In an integrated EEPROM, this increases the number of times the device can be reprogrammed without apparent degradation. If a 64K-bit memory device, for example, is not equipped with the self-correcting function of this embodiment of the invention, degradation of even one of the 64K memory cells through reprogramming can render the integrated circuit defective, whereas with the self-correcting function of this embodiment, degradation can be tolerated in up to 8K memory cells without the device becoming defective.

(3) The self-correcting function of this embodiment can correct not only one-bit errors in the read data; it can detect and correct errors in any odd number of bits (1, 3, 5, or 7 bits). In the prior art it was possible only to detect and correct one-bit errors; errors in two or more bits could not be corrected. Accordingly, a device according to this embodiment has greater error-detecting and correcting capability for certain degradation modes than in the prior art.

Next a second embodiment of the invention will be described with reference to FIG. 7. The second embodiment is similar to the first embodiment in FIG. 6 except that the data latch select circuits 51 and the sense voltage switching circuit 56 in FIG. 6 are eliminated and the output of the exclusive-OR gate 54 is supplied to the self-correcting circuit 70, which comprises AND gates 73-0 to 73-7 and exclusive-OR gates 74-1 to 74-7.

In this second embodiment of the invention, when an arbitrary address is read, two differing sense voltages, a first sense voltage Vr1 and a second voltage Vr2, are applied in sequence to the gate electrodes of the memory cells 31 and parity cell 32 selected by the row decoder 40 and the column decoder 41 to obtain two sets of read data, denoted the first read data and second read data, from the sense amplifiers 50. The timing of the application of the first sense voltage Vr1 and the second sense voltage Vr2 is controlled by a control circuit 45, which is also connected to the clock input terminals of the first latch circuits 52 and the second latch circuits 53 and controls these latch circuits 52 and 53 so that the first latch circuits 52 latch data output when the first sense voltage Vr1 is applied and the second latch circuits 53 latch the data output when the second sense voltage Vr2 is applied. As in the first embodiment, the exclusive-OR circuit 54 checks the parity of the first read data, and the agreement checking circuit 60 checks for agreement between the first and second read data.

The output of the exclusive-OR gate 54 is stored in a latch circuit 75 and supplied to the AND gates 73-0 to 73-7, which also receive the outputs of the exclusive-OR gates 60-0 to 60-7, respectively. The outputs of the AND gates 73-0 to 73-7 are "1" when the first and second read data disagree and there is a parity error in the first read data. In all other cases the outputs of the AND gates 73-0 to 73-7 are "0". An output of "1" from one of the AND gates 73-0 to 73-7 is "1" thus indicates that the corresponding memory cell is defective and the first read data is incorrect. When the output of one of the AND gates 73-0 to 73-7 is "1," the corresponding exclusive-OR gate 74-0 to 74-7 inverts the first read data. When the output of one of the AND gates 73-0 to 73-7 is "0," the corresponding exclusive-OR gate 74-0 to 74-7 passes the first read data through unaltered. In either case the correct data value is obtained at the output terminal 80-0 to 80-7.

Thus in the second embodiment described, the first and the second sense voltages Vr1 and Vr2 are applied in turn irrespective of whether a parity error is detected as a result of the application of the first sense voltage. The external circuit 110 connected to the output terminals 80-0 to 80-7 is arranged to recognize, as the correct read data, the data on the terminals 80-0 to 80-7 upon application of the second sense voltage Vr2.

The second embodiment of this invention provides the same advantages as the first embodiment, with the additional advantage of a simpler circuit configuration, due to the elimination of the sense voltage switching circuit 56 and the data latch select circuits 51 which operated in the first embodiment depending on the parity of the data.

Figure 8:
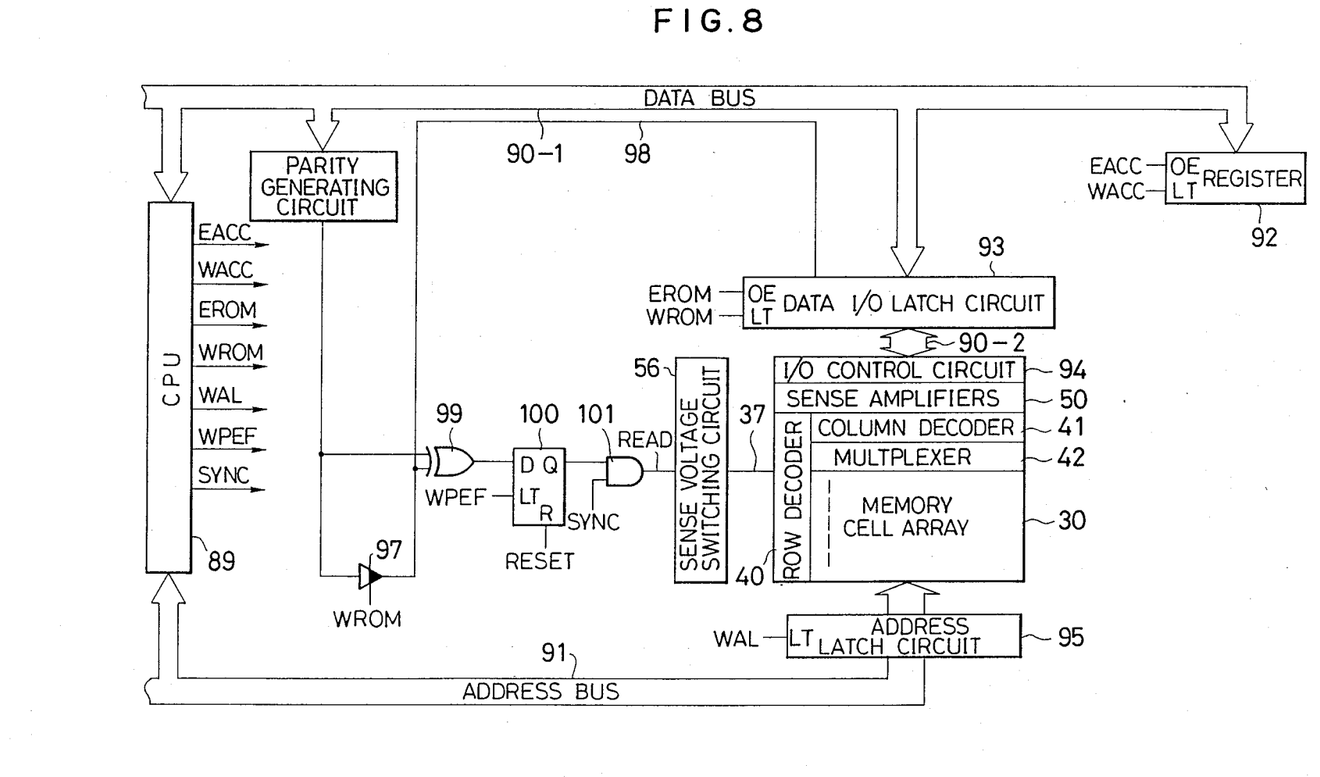
FIG. 8 is a block diagram of the memory section of a microcomputer with a self-correcting semiconductor memory according to a third embodiment of this invention.

FIG. 8 is a block diagram of the memory section of a microcomputer with a self-correcting semiconductor memory according to a third embodiment of this invention. Elements that are the same as in FIG. 6 are numbered with the same reference numerals.

First the principle of error correction in this third embodiment of the invention will be explained.

(a) In an EEPROM memory cell, for example, if charge escapes from a memory cell in the erased ("1") state, when the cell is read using the normal sense voltage Vr1 (2 V), the output data will remain "1." An incorrect "0" is never output from an erased memory cell.

(b) If charge escapes from a memory cell in the written ("0") state, when the cell is read using the normal sense voltage Vr1 (2 V), the data output may change from "0" to "1." The correct "0" data output can be obtained, however, by reading the memory cell at a higher sense voltage Vr2 (5 V).

(c) In (b), it can be determined whether a "0" has changed to a "1" by checking for even parity (or odd parity) among the read data bits and the parity bit.

Precise error correction is possible by executing an error-correcting procedure comprising the following steps (1) to (3), which are based on principles (a) to (c) above.

(1) Always read data twice.

(2) Check the parity of the data read the first time with the normal sense voltage Vr1 (2 V). If a parity error is detected, increase the sense voltage to Vr2 (=5 V) when reading the second time; otherwise, perform the second read at the normal sense voltage Vr1.

(3) The second read data are valid.

These principles and steps are incorporated into the embodiment in FIG. 8, which will be described next.

The microcomputer comprises a central processing unit CPU 89, a memory unit for storing data, and other units such as input/output units not shown in the drawing. The memory unit comprises a memory cell array 30 and auxiliary circuits to be described later.

Read and write data are transferred between the memory unit and the CPU 89 via a data bus 90-1, while the memory address of the data to be written or read is sent from the CPU 89 to the memory unit via an address bus 91. The reading and writing of memory data are controlled by control signals such as those labeled EACC (Enable Access), WACC (Write Access), EROM (Enable ROM), WROM (Write ROM), WAL (Write Address Latch), WPEF (Write Parity Error Flag), and SYNC (Synchronize) which are output from the CPU 89 in synchronization with the system clock CLK. A register 92 and a data input/output latch 93 are connected to the data bus 90-1. The data input/output latch 93 is connected via a data/parity bus 90-2 to an input/output control circuit 94, which is connected via the sense amplifier 50, row decoder 40, column decoder 41, and multiplexer 42 to the memory cell array 30. The parity cells in the memory cell array 30 are connected via the sense line 37 to the sense voltage switching circuit 56. The row decoder 40 and column decoder 41 are connected through an address latch circuit 95 to the address bus 91.

The memory cell array 30 is organized into a plurality of word units each consisting of, for example, eight data memory cells and one parity cell. The register 92, which comprises a device such as an accumulator, is for temporary storage of data to be written in the memory cell array 30, and of data read from the memory cell array 30, and has an Output Enable (OE) and a Latch (LT) terminal. When an EACC control signal is received at the OE terminal, the data stored in the register 92 are output to the data bus 90-1. When the control signal WACC is received at the LT terminal, the data on the data bus 90-1 are stored in the register 92. The data input/output latch 93 has similar OE and LT terminals. When the data input/output latch 93 receives an EROM control signal at its OE terminal, it places the data read from the memory cell array 30 on the data bus 90-1. When the data input/output latch 93 receives a WROM signal at its LT terminal, it latches the data on the data bus 90-1. There is also an input/output control circuit 94 that controls the operations of writing data to the memory cell array 30 and reading data from the memory cell array 30 according to control signals received from the CPU 89. The address latch circuit 95 latches the address on the address bus 91 when it receives a WAL control signal at its LT terminal. The row decoder 40, the column decoder 41, and the multiplexer 42 form a means of selecting memory and parity cells in the memory cell array 30. The sense voltage switching circuit 56 applies the first and second sense voltages Vr1 and Vr2 to the parity cell and, together with the sense amplifier 50 and the data input/output latch 93, forms the means of reading the data.

A parity generating circuit 96 is connected to the data bus 90-1. The parity generating circuit 96 is connected through a tri-state buffer 97 and a 1-bit parity bit line 98 to the data input/output latch 93. The parity generating circuit 96 and the parity bit line 98 are connected to an exclusive-OR gate 99 for parity checking. The exclusive-OR gate 99 is connected through a latch circuit 100 and an AND gate 101 to the sense voltage switching circuit 56.

The parity generating circuit 96, which comprises a plurality of components such as exclusive-OR gates, functions as a parity generating means for generating a parity bit to satisfy, for example, an even parity condition when combined with the data on the data bus 90-1. It is possible for the parity generating means to be implemented by a program running on the CPU 89. When the WROM control signal is active, the tri-state buffer 97 sends the parity bit output from the parity generating circuit 96 on the parity bit line 98. When the WROM control signal is inactive, the tri-state buffer 97 is in the three-state (high-impedance state). The latch circuit 100 latches the output of the exclusive-OR gate 99 when it receives the WPEF control signal at its LT terminal, and resets when it receives the RESET control signal at its R terminal. The Q output terminal of the latch circuit 100 is connected to the AND gate 101. The Q output is used as a parity error flag to notify the CPU 89 of a parity error so that the CPU 89 can, for example, halt other operations. The AND gate 101 synchronizes the Q output with the synchronization signal SYNC to form a READ signal which it supplies to the sense voltage switching circuit 56. When the READ signal is active (High), the sense voltage switching circuit 56 generates the second sense voltage Vr2. When the READ signal is inactive (Low), the sense voltage switching circuit 56 generates the first sense voltage Vr1.

Figure 9:
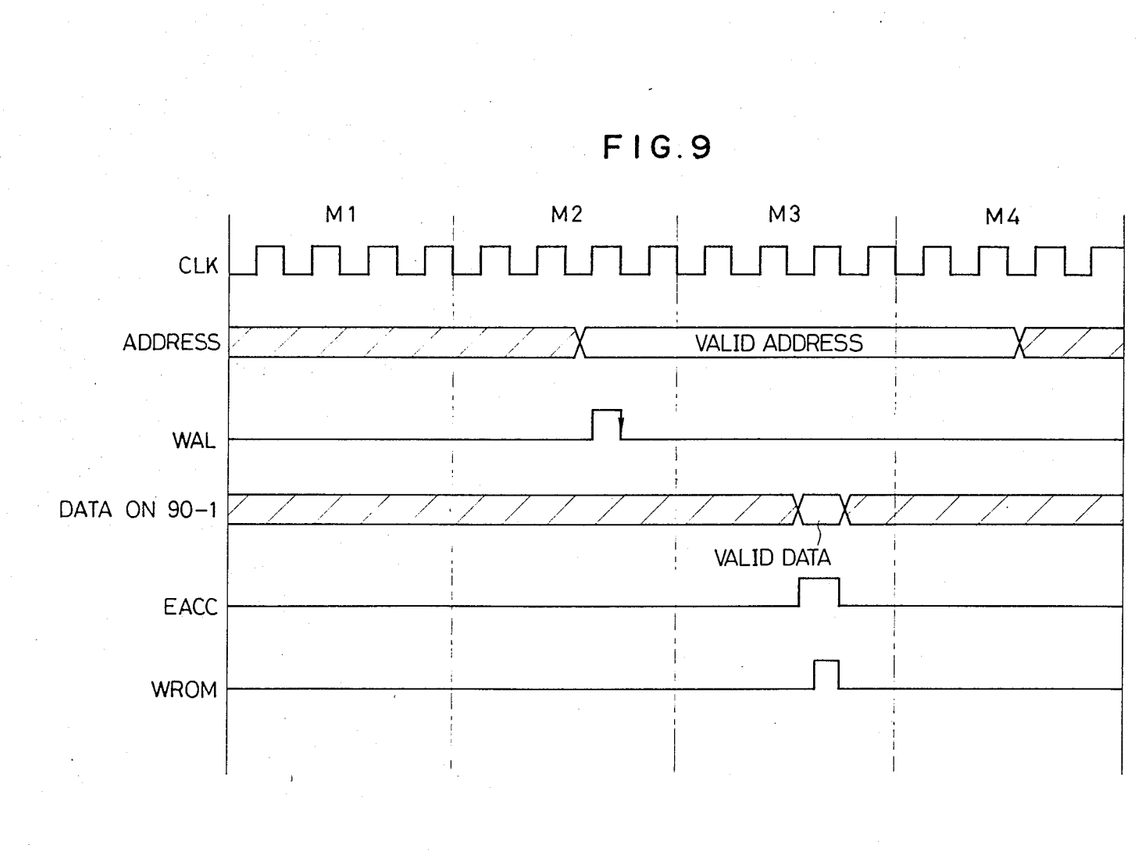
FIG. 9 is a timing chart showing how data are written in the memory unit in FIG. 8.
Figure 10:
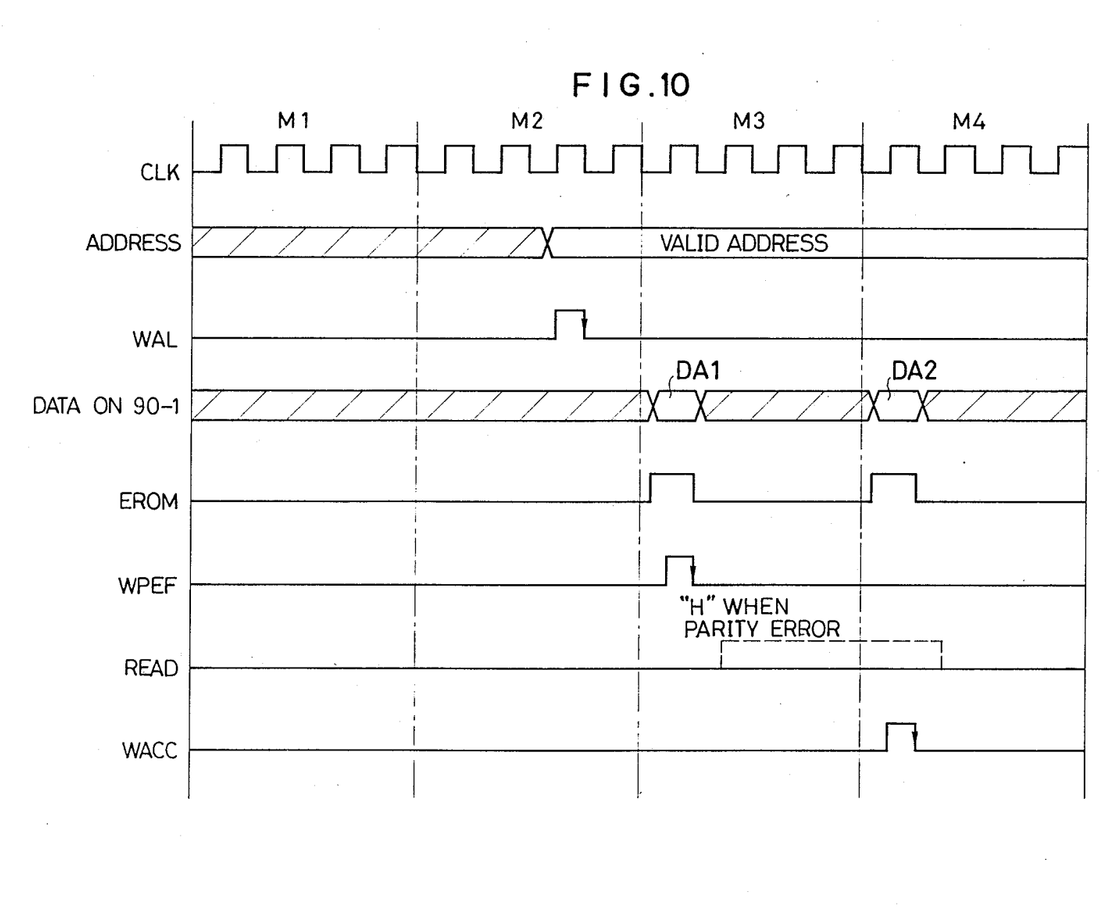
FIG. 10 is a timing chart showing how data are read from the memory unit in FIG. 8.

The write (1) and read (2) operations performed by the microcomputer in FIG. 8 will be explained with reference to FIGS. 9 and 10. FIG. 9 is a timing chart showing how data are written in the memory unit in FIG. 8. FIG. 10 is a timing chart showing how data are read from the memory unit in FIG. 8.

The timing in FIG. 9 and FIG. 10 is synchronized with the microcomputer's system clock CLK and shows one instruction cycle (the time taken by the CPU 89 to execute one instruction) consisting of four machine cycles M1 to M4. The address bus and data bus are shaded in the drawing during intervals when they do not carry valid data.

(1) Write operation

As shown in FIG. 9, the operation of writing data stored in the register 92 into the memory cell array 30 comprises the following steps (i) to (iii).

(i) The write address in the memory cell array 30 is placed on the address bus 91 and latched in the address latch circuit 95 at a time determined by the WAL control signal. The address latch circuit 95 supplies the latched address to the row decoder 40 and the column decoder 41. The row decoder 40 decodes the address and selects a row in the memory cell array 30. The column decoder 41 decodes the address and selects a column in the memory cell array 30 through the multiplexer 42.

(ii) At a time determined by the EACC control signal, the data in the register 92 are placed on the data bus 90-1. The parity generating circuit 96 reads the data bits on the data bus 90-1 and generates a parity bit for them. The tri-state buffer 97 sends the parity bit generated by the tri-state buffer 97 on the parity bit line 98 in synchronization with the WROM control signal. The data input/output latch 93 latches the parity bit on the parity bit line 98 and the data bits on the data bus 90-1 in synchronization with the WROM control signal.

(iii) The data input/output latch 93 writes the parity and data bits it has latched in the selected memory cells via the bus 90-2 and the input/output control circuit 94.

(2) Read operation

As shown in FIG. 10, the operation of reading data from the memory cell array 30 and storing the data in the register 92 comprises the following steps (i) to (vii).

(i) The read address in the memory cell array 30 is placed on the address bus 91 and latched in the address latch circuit 95 at a time determined by the WAL control signal. The address latched in the address latch circuit 95 selects parity and memory cells in the memory cell array 30 as in step (i) of the write operation (1).

(ii) The parity and data bits in the selected parity and data memory cells are read using the first sense voltage Vr1 (2 V) supplied by the sense voltage switching circuit 56, detected and amplified by the sense amplifier 50, and supplied through the input/output control circuit 94 and the bus 90-2 to the data input/output latch 93. When it receives the EROM control signal, the data input/output latch 93 latches these parity and data bits, places the latched data bits on the data bus 90-1, and sends the latched parity bit to the parity bit line 98. The data obtained at this time are the first read data indicated as DA1 in FIG. 10.

(iii) The parity generating circuit 96 generates a parity bit from the data bits on the data bus 90-1 and furnishes it to the exclusive-OR gate 99. The exclusive-OR gate 99 obtains the logical exclusive-OR of the parity bit output by the parity generating circuit 96 and the parity bit read from the memory cell array 30 and placed on the parity bit line 98. If these two parity bits match, the output of the exclusive-OR gate 99 is "0." If they do not match, the output is "1." The latch circuit 100 receives the output from the exclusive-OR gate 99 and latches it in synchronization with the WPEF signal.

(iv) The AND gate 101 synchronizes the output of the latch circuit 100 with the SYNC synchronization signal and sends it as a READ signal to the sense voltage switching circuit 56. If the output of the latch circuit 100 is High, that is, if there is a parity error, the READ signal is High as shown in FIG. 10.

(v) The sense voltage switching circuit 56 generates the first sense voltage Vr1 (2 V) if the READ signal is Low, or the second sense voltage Vr2 (5 V) if the READ signal is High, and sends this sense voltage on the sense line 37 to the parity and memory cells.

(vi) The data input/output latch 93 outputs the parity and data bits read from the parity and memory cells on the parity bit line 98 and the data bus 90-1 in synchronization with the EROM control signal. The data at this time are indicated in FIG. 10 as the second read data DA2.

(vii) When it receives the WACC control signal, the register 92 latches the correct data from the data bus 90-1. This completes the reading of the error-corrected data.

In the embodiment in FIG. 8, as in the embodiment in FIG. 6, one parity bit per data word suffices for the self-correction function, so the microcomputer chip can be reduced in size and cost as compared with the prior art. The complex error correcting code circuit required in the prior art is replaced by the sense voltage switching circuit 56, the parity generating circuit 96, the exclusive-OR gate 99, and the latch circuit 100, so the circuit configuration is simplified and the data read-out and correction are performed in one instruction. This enables the number of program steps to be reduced.

The scope of this invention is not limited to the embodiments described above, but includes variations such as the following:

(a) In the description of the first and second embodiments of the invention, it was assumed for simplicity that if charge had escaped from the memory transistor in a memory cell 31, when the stored bit was read it would be be read as a "1," but with slight modifications to the sense amplifier 50 it is possible to have the bit read as a "0." In this case, if charge escapes from a memory cell 31 in the written state, the output data will not change, but if charge escapes from a memory cell 31 in the erased state, the output data will change from "1" to "0." The second sense voltage Vr2 for detecting the error bit can then be set lower than the first sense voltage Vr1 to obtain the same effect as in the embodiments described.

(b) In FIG. 6, the self-correcting circuit 70 can be modified to perform the self-correcting operation by receiving the output of the agreement checking circuit 60 and the outputs of the first latch circuit 52 and the second latch circuit 53.

(c) In the first and second embodiments, it is possible to use three or more sense voltages.

(d) The hardware means for reading and writing data in FIG. 8 can be replaced, as far as possible, with software means executing on the CPU 89 to reduce the chip size.

Figure 7:
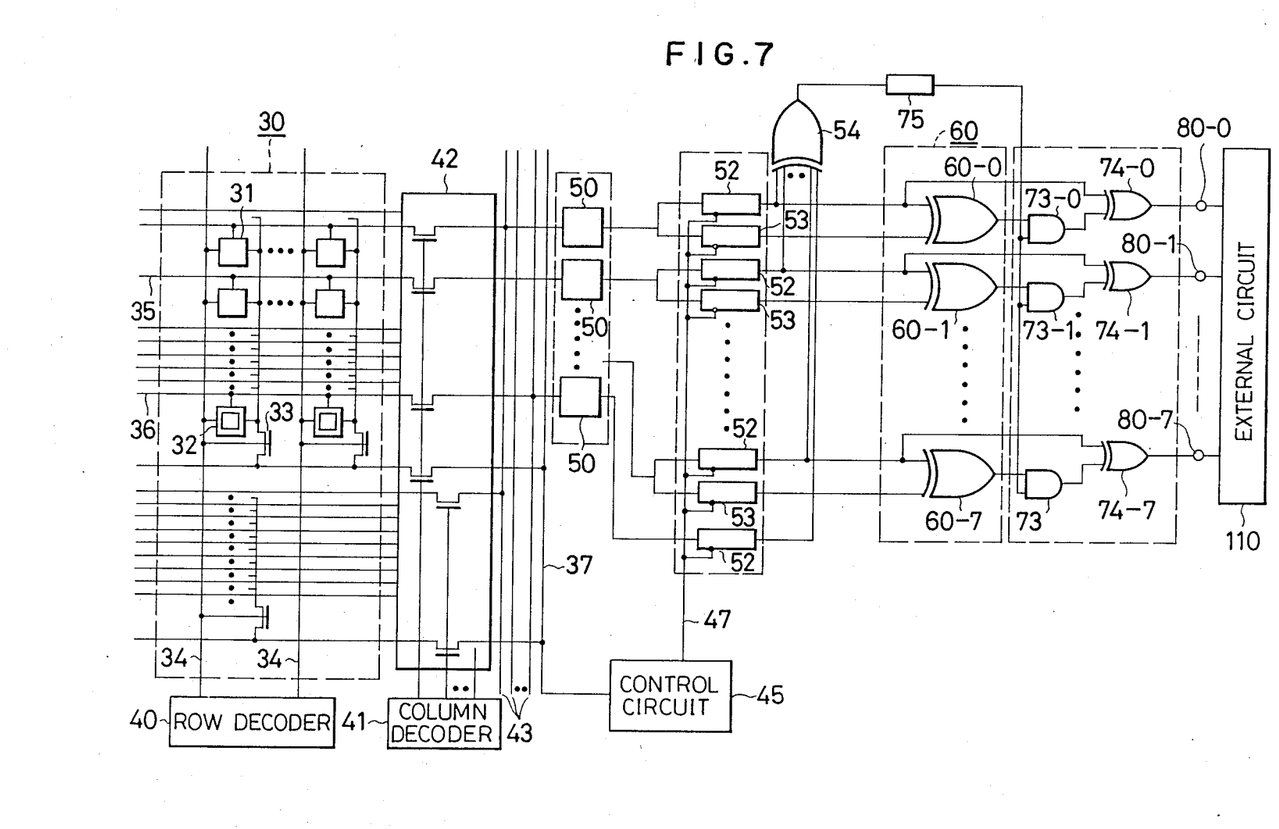
FIG. 7 is a partial schematic diagram of a microcomputer according to another embodiment of the invention.

(e) In FIGS. 6 to 8, the word length can be other than eight bits, the invention can be applied to nonvolatile memories other than EEPROMs, and various other modifications are possible.

What is claimed is:

1. A self-correcting semiconductor memory device comprising:
a memory cell array having sets of cells, each set comprising data cells for storing data bits and a parity cell for storing a parity bit for detecting bit errors generated by said data cells;
selection means for selecting an arbitrary set of cells;
read-out means for applying a first sense voltage to the selected set of cells to produce first read data comprising data bits and a parity bit;
parity checking means for checking the parity of the first read data and producing an output indicating whether a parity error is present;
said read-out means capable of applying a second sense voltage of a level different from the level of said first sense voltage to said selected set of cells to produce second read data comprising data bits and a parity bit; and correction means for receiving the read data and producing correct read data, said correction means correcting any error in the data bits of the read data responsive to the read data and the output of the parity checking means.

2. A memory device according to claim 1, further comprising agreement checking means for checking the agreement between the data bits of said first read data and the data bits of said second read data;
wherein said correction means is also responsive to the output of said agreement checking means.

3. A memory device according to claim 2, wherein said read-out means comprises first latch means for storing the data bits of said first read data and second latch means for storing the data bits of said second read data; and
said correction means comprises means for checking agreement between the data bits of said first read data stored in said first latch means and the corresponding data bits of said second read data stored in said second latch means, and means for inverting the bit of said first read data which said agreement checking means finds to disagree with the corresponding data bit of said second read data.

4. A memory device according to claim 2, wherein said correction means produces said data bits of said first read data without correction, recognizing said data bits of said first read data as the correct read data, when said parity checking means does not find a parity error.

5. A memory device according to claim 4, wherein said second latch means stores said first read data upon application of said first sense voltage; said first latch means comprises, for each of said data bits, a latch circuit; said second latch means comprises, for each of said data bits, a latch circuit; and said correction means comprises, for each of said data bits, an exclusive-OR gate receiving the outputs of the latch circuit in said first latch means and the latch circuit in said second latch means, an inverter receiving the output of the exclusive-OR gate, and an AND gate receiving the output of said latch circuit in said first latch means and the output of said inverter.

6. A memory device according to claim 5, wherein when said parity checking means does not find a parity error upon the application of the first sense voltage said read-out means applies said first sense voltage for the second time, and the outputs of the correction means upon said second application of said first sense voltage are used as the correct read data.

7. A memory device according to claim 5, wherein when said parity checking means finds a parity error upon the application of the first sense voltage said read-out means applies said second sense voltage and the outputs of the correction means upon said application of the first sense voltage are used as the correct data.

8. A memory device according to claim 4, wherein said read-out means applies said first and said second sense voltages successively irrespective of the result of the parity check; said first latch means comprises, for each of said data bits, a latch circuit for storing the corresponding data bit in said first read data; said second latch means comprises, for each of said data bits, a latch circuit storing the corresponding data bit in said second read data; and said correction means comprises, for each of said data bits, a first exclusive-OR gate receiving the outputs of the latch circuit in said first latch means and the latch circuit in said second latch means, an AND gate receiving the output of said first exclusive-OR gate and an output indicating that a parity error is present, and a second exclusive-OR gate receiving the output of said latch circuit of said first latch means and the output of said AND gate.

9. A memory device according to claim 1, wherein said read-out means applies said second sense voltage only when said parity checking means finds a parity error, and applies said first sense voltage for the second time when said parity checking means does not find a parity error; and
said correction means produces the data bits of said second read data, recognizing said second read data as the correct read data, when said parity checking means finds a parity error, and produces the data bits of said first read data upon the second application of said first sense voltage, recognizing the data bits of said first read data as the correct read data, when said parity checking means does not find a parity error.

10. A memory device according to claim 9, wherein each of the data cells comprises:
a select transistor having a source electrode, a drain electrode connected to one of said bit lines, and a gate electrode connected to one of said word lines; and
a memory transistor having a source electrode, a drain electrode connected to the source electrode of said select transistor, a gate electrode to which said first and second sense voltages are applied, and a floating gate.

11. A memory device according to claim 10, wherein:
said read-out means comprises sense amplifiers for reading the data bits and the parity bit stored in said selected set of cells, a sense voltage selection means that, when a bit error is detected by said parity checking means upon application of said first sense voltage to said gate electrodes of said memory transistors, selects said second sense voltage for application to said gate electrodes of said memory transistors, a first latch means for temporary storage of the data bits read by said sense amplifiers when said first sense voltage is applied, and a second latch means for temporary storage of the data bits read by said sense amplifiers when said second sense voltage is applied;
said memory device further comprises agreement checking means for checking the agreement between the data bits of said first read data and the data bits of said second read data, said agreement checking means comprising agreement circuits for checking agreement of the data bits output from said first latch means and the corresponding data bits output from said second latch means; and
said correction means comprises self-correcting circuits for receiving respective outputs from said agreement checking circuits and the outputs from at least one of said first latch means and said second latch means, and correcting the read data.

12. A memory device according to claim 1, wherein said data cells are nonvolatile memory cells each having a gate electrode and capable of storing a data bit;
said parity cell has a gate electrode and is capable of storing a parity bit for detecting bit errors in the data bits stored in said data cells; and
said memory cell array further comprises:
word lines for selecting said set of cells;

data bit lines for receiving data bits from respective data cells; and a parity bit line for receiving the parity bit from said parity cell.

13. A memory device according to claim 12, wherein said selection means comprises means for selecting, via said word lines, said bit lines, and said parity bit line, an arbitrary set of cells.

14. A memory device according to claim 1, wherein said parity checking means comprises:

parity generating means for generating a parity bit according to the data bits of said first read data from said data cells such that the combination of the parity bit and the data bits satisfies a parity condition; and means for checking agreement between the output of the parity generating means and the parity bit read from the parity cell.

15. A memory device according to claim 14, wherein said agreement checking means comprises an exclusive-OR gate receiving the output of the parity generating means and the output of the parity cell.

16. A memory device according to claim 15, wherein said parity checking means further comprises a latch circuit for latching the output of said exclusive-OR gate.

17. A memory device according to claim 14, further comprising writing means for writing data bits and a parity bit into the data cells and the parity cell;

wherein said parity generating means produces a parity bit according to the data bits to be written into the data cells such that the combination of the parity bit and the data bits satisfies the parity condition; and said writing means adopts the output of the parity generating means as the parity bit to be written into the parity cell.

18. A microcomputer comprising:

a memory cell array having sets of cells, each set comprising data cells for storing data bits and a parity cell for storing a parity bit for detecting bit errors generated by said data cells;

selection means for selecting an arbitrary set of cells;

read-out means for applying a first sense voltage to the selected set the data cells and the parity cell to produce first read data comprising data bits and a parity bit;

parity checking means for checking the parity of the first read data and producing an output indicating whether a parity error is present;

said read-out means capable of applying a second sense voltage of a level different from the level of said first sense voltage to said selected set of cells to produce second read data comprising data bits and a parity bit; and correction means for receiving the read data and producing correct read data, said correction means correcting any error in the data bits of the read data responsive to the read data and the output of the parity checking means.

19. A microcomputer according to claim 18, further comprising a central processing unit for executing a self-correcting read cycle by causing said parity checking means to check parity in one machine cycle, then causing said read-out means to apply either said first sense voltage or said second sense voltage in the next machine cycle depending on the result of the parity check.

20. A microcomputer according to claim 18, wherein said parity checking means comprises:

parity generating means for generating a parity bit according to the data bits of said first read data from said data cells such that the combination of the parity bit and the data bits satisfies a parity condition; and means for checking agreement between the output of the parity generating means and the parity bit read from the parity cell.

21. A microcomputer according to claim 20, wherein said agreement checking means comprises an exclusive-OR gate receiving the output of the parity generating means and the output of the parity cell.

22. A microcomputer according to claim 21, wherein said parity checking means further comprises a latch circuit for latching the output of said exclusive-OR gate.

23. A microcomputer according to claim 20, further comprising writing means for writing data bits and a parity bit into a selected set of cells;

wherein said parity generating means produces a parity bit according to the data bits to be written into the data cells such that the combination of the parity bit and the data bits satisfies the parity condition; and said writing means adopts the output of the parity generating means as the parity bit to be written into the parity cell.

* * * * *